(12) United States Patent
Padilla

(10) Patent No.: US 11,756,625 B2
(45) Date of Patent: Sep. 12, 2023

(54) ADAPTIVE TEMPERATURE COMPENSATION FOR MEMORY DEVICES

(71) Applicant: Micron Technology, Inc., Boise, ID (US)

(72) Inventor: Renato C. Padilla, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/200,591

(22) Filed: Mar. 12, 2021

(65) Prior Publication Data
US 2022/0293183 A1 Sep. 15, 2022

(51) Int. Cl.
| | |
|---|---|
| G11C 8/00 | (2006.01) |
| G11C 16/10 | (2006.01) |
| G11C 7/04 | (2006.01) |
| G11C 16/30 | (2006.01) |
| G11C 16/26 | (2006.01) |

(52) U.S. Cl.
CPC ............ *G11C 16/10* (2013.01); *G11C 7/04* (2013.01); *G11C 16/26* (2013.01); *G11C 16/30* (2013.01)

(58) Field of Classification Search
CPC ......... G11C 16/10; G11C 16/26; G11C 16/30; G11C 7/04
See application file for complete search history.

(56) References Cited

U.S. PATENT DOCUMENTS 11,210,031 B1 * 12/2021 Mekhanik ............. G06F 3/0679
2017/0255403 A1 * 9/2017 Sharon .................. G11C 16/26

\* cited by examiner

*Primary Examiner* — Uyen Smet
(74) *Attorney, Agent, or Firm* — Lowenstein Sandler LLP

(57) ABSTRACT

In one embodiment, a memory system receives a request to perform a memory access operation, the request identifying a memory cell in a segment of the memory system comprising at least a portion of the memory device. The system determines that an operating temperature of the memory device satisfies a threshold criterion. Responsive to determining that the operating temperature of the memory device satisfies the threshold criterion, the system determines a temperature compensation value corresponding to an access control voltage adjustment value specific to the segment of the memory system. The system adjusts, based on an amount represented by the temperature compensation value, an access control voltage applied to the memory cell during the memory access operation.

20 Claims, 8 Drawing Sheets

200

```
┌─────────────────────────────────────────────┐
│ RECEIVE A REQUEST TO PERFORM A MEMORY ACCESS│
│ OPERATION, THE REQUEST IDENTIFYING A MEMORY │
│ CELL IN A SEGMENT OF THE MEMORY SYSTEM      │
│ COMPRISING AT LEAST A PORTION OF THE        │
│ MEMORY DEVICE                               │
│ 210                                         │
└─────────────────────────────────────────────┘
                      │
                      ▼
┌─────────────────────────────────────────────┐
│ DETERMINE THAT AN OPERATING TEMPERATURE OF  │
│ THE MEMORY DEVICE SATISFIES A THRESHOLD     │
│ CRITERION                                   │
│ 220                                         │
└─────────────────────────────────────────────┘
                      │
                      ▼
┌─────────────────────────────────────────────┐
│ RESPONSIVE TO DETERMINING THAT THE OPERATING│
│ TEMPERATURE OF THE MEMORY DEVICE SATISFIES  │
│ THE THRESHOLD CRITERION, DETERMINE A        │
│ TEMPERATURE COMPENSATION VALUE              │
│ CORRESPONDING TO AN ACCESS CONTROL VOLTAGE  │
│ ADJUSTMENT VALUE SPECIFIC TO THE SEGMENT    │
│ OF THE MEMORY SYSTEM                        │
│ 230                                         │
└─────────────────────────────────────────────┘
                      │
                      ▼
┌─────────────────────────────────────────────┐
│ ADJUST, BASED ON AN AMOUNT REPRESENTED BY   │
│ THE TEMPERATURE COMPENSATION VALUE, AN      │
│ ACCESS CONTROL VOLTAGE APPLIED TO THE       │
│ MEMORY CELL DURING THE MEMORY ACCESS        │
│ OPERATION                                   │
│ 240                                         │
└─────────────────────────────────────────────┘
```

FIG. 2

US 11,756,625 B2

ADAPTIVE TEMPERATURE COMPENSATION FOR MEMORY DEVICES

TECHNICAL FIELD

Embodiments of the disclosure relate generally to memory sub-systems, and more specifically, relate to an adaptive temperature compensation for memory devices.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 2 is a flow diagram of an example method to calculate a temperature compensation value to adjust a voltage level in accordance with some embodiments of the present disclosure.

DETAILED DESCRIPTION

Figure 1:
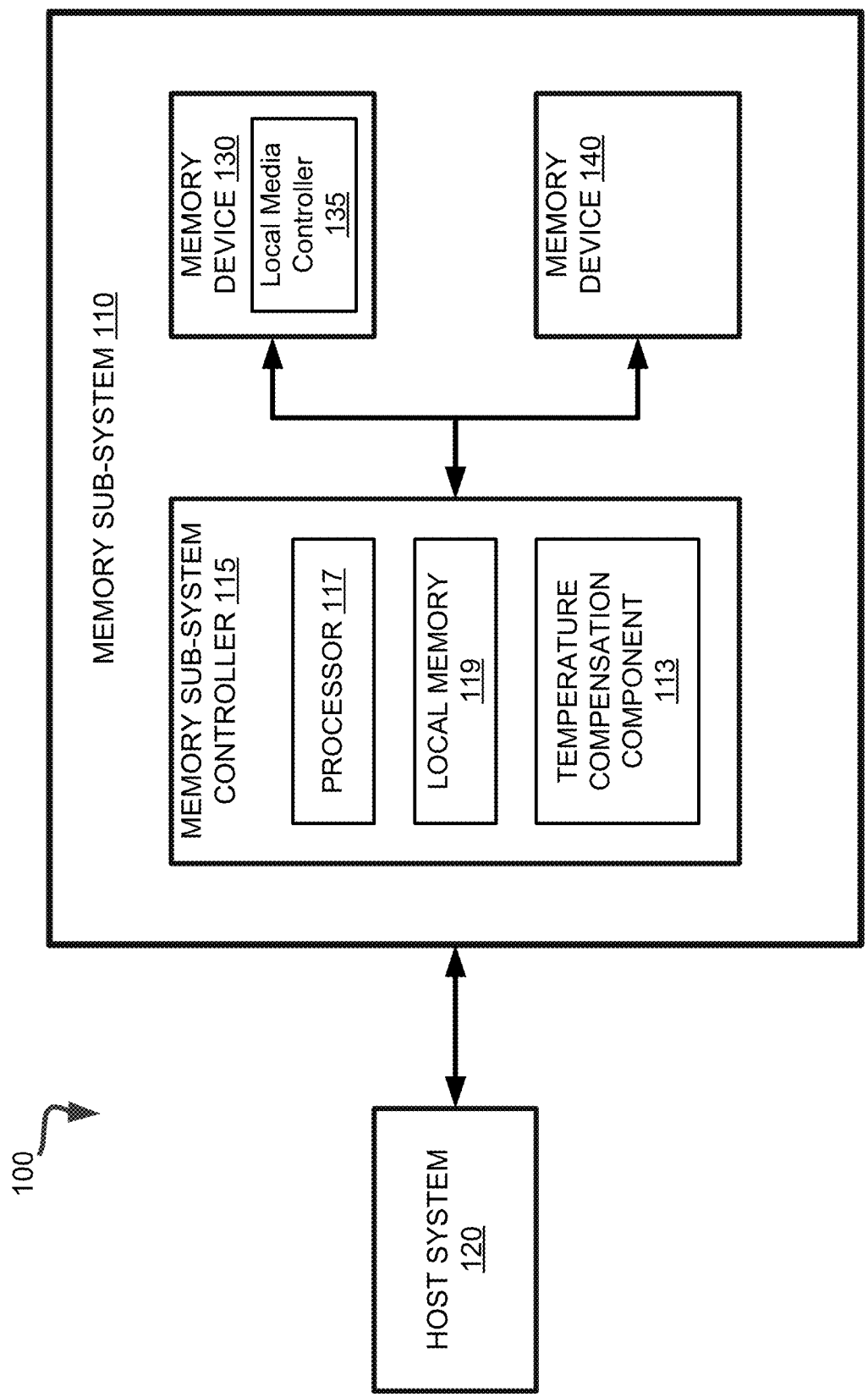
FIG. 1 illustrates an example computing system that includes a memory sub-system in accordance with some embodiments of the present disclosure.

Aspects of the present disclosure are directed to an adaptive temperature compensation scheme for memory devices in a memory sub-system. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

The memory system can store the data at memory cells of a memory device included in the memory system. Each of the memory cells can store one or more bits of binary data corresponding to the data received from the host system. In one example, the memory devices of the storage system can include a single-level-cell (SLC) memory where each memory cell of the SLC memory can be programmed with a single bit of data. When storing one bit of data in the SLC memory, a range of possible voltage levels of a memory cell is divided into two ranges. For example, the two ranges can include a first threshold voltage range that corresponds to the logical data value "1" and a second threshold voltage range that corresponds to the logical data value "0."

Some storage systems can include higher density memory devices such as multi-level-cell (MLC) memory that is programed by storing 2 bits per memory cell, 3 bits per memory cell, 4 bits per memory cell, or more bits per memory cell. Data can be stored at an MLC memory based on a total voltage range that is divided into some number of distinct threshold voltage ranges for the memory cells. Each distinct threshold voltage range corresponds to a predetermined value for the data stored at the memory cell.

One type of memory device includes memory cells configured as quad-level cell (QLC) memory. In QLC memory, each memory cell can store four bits of data. For example, in a QLC memory, a memory cell can store four bits of data (e.g., 1111, 0000, 1101, etc.) corresponding to data received from the host system. In QLC memory, each bit of the memory cell is stored at a different portion (also referred to as a "page" hereafter) of the memory cell. A memory cell of the QLC memory can have a total of four pages. For example, the memory cell can include a lower page (LP), an upper page (UP), an extra page (XP) and a top page (TP), where each page stores a bit of data. In a memory cell for a QLC memory, each combination of four bits can correspond to a different threshold voltage range (also referred to as a "level" hereafter). For example, a first level of the memory cell can correspond to 1111, a second level can correspond to 0111, and so on. Because a memory cell for a QLC memory includes 4 bits of data, there are a total of 16 possible combinations of the four bits of data. Accordingly, a memory cell for a QLC memory can be programmed to one of 16 different levels.

Conventional memory systems can store multiple bits of data in a single memory cell by mapping a sequence of bits to each of the different voltage levels of the memory cell. For example, a particular logical data value (e.g., '1100') can be assigned to one voltage level and another logical data value (e.g., '1010') can be assigned to another voltage level of the memory cell. The data can be stored into the memory cell by using a programming operation that applies a sequence of programming pulses to the memory cell. The sequence of programming pulses can be applied to the memory cell until a voltage level corresponding to the data value has been reached at the memory cell. After the memory cell has been programmed, data can be read from the memory cell by applying a read voltage to the memory cell at the corresponding threshold voltage range and translating the programed voltage level at the memory cell.

Under certain circumstances, the memory system can be operated in an environment with varying temperature (e.g., between 0 to 75 degrees Celsius). Temperature variations between when data is written to a memory cell and when data is read from the memory cell can impact the voltages stored in and read from the memory cell. This change in temperature between when the data is written and when the data is read from a memory cell can be referred to as the cross temperature.

Cross temperature conditions occur when the memory cell is programmed at a hot temperature range (65-70° C.) and read at a cold temperature range (20-25° C.) or when the memory cell is programmed at a cold temperature range (20-25° C.) and read at a hot temperature range (65-70° C.). For illustrative purposes, temperature ranges (20-25° C.) and (65-70° C.) are used, but other temperatures ranges are also possible.

Figure 3A:
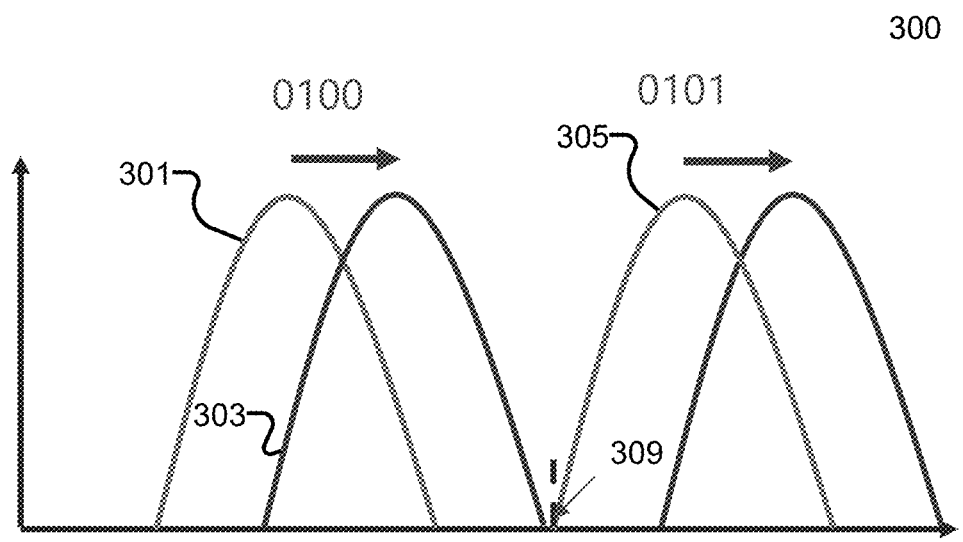
FIG. 3A is a block diagram illustrating voltage distribution shifts in accordance with some embodiments of the present disclosure.

Referring to FIG. 3A, for one example, if a memory cell in a QLC memory is programmed with a voltage level of 2 V corresponding to a data value of '0100' at 70° C., and the temperature changes over time to 25° C. when the memory cell is read, the apparent voltage level may have shifted to 2.15 V. Depending on how the threshold voltage ranges (i.e., levels) are defined in the memory cell, the apparent read voltage may reflect a different data value (e.g., '0101'). This shift can result in increased raw bit error rate (RBER) which can be beyond the error correction capability of the underlying error correction code (ECC).

Figure 3B:
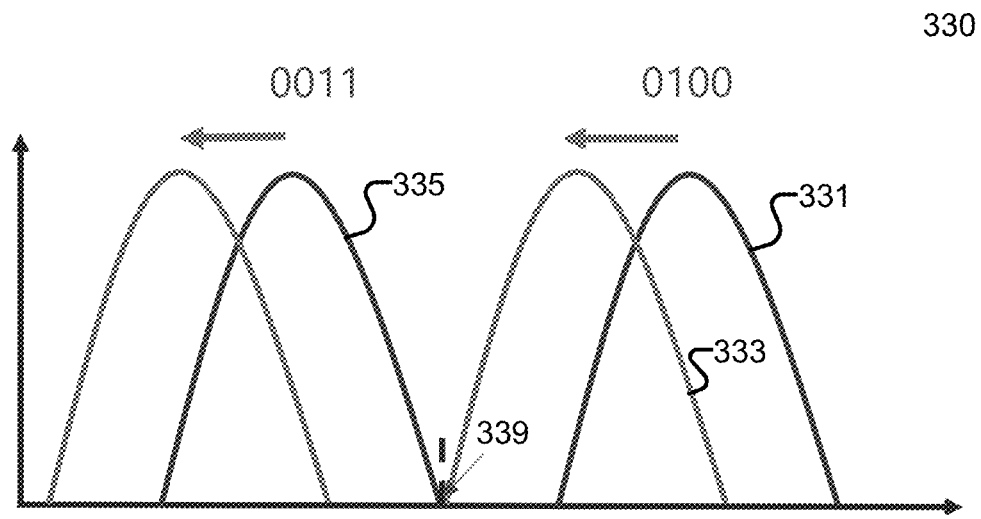
FIG. 3B is a block diagram illustrating voltage distribution shifts in accordance with some embodiments of the present disclosure.

Referring to FIG. 3B, for another example, if a memory cell in a QLC memory is programmed with a voltage level of 2 V corresponding to a data value of '0100' at 25° C., and the temperature changes over time to 70° C. when the memory cell is read, the apparent voltage level may have shifted to 1.85 V. Depending on how the threshold voltage ranges (i.e., levels) are defined in the memory cell, the apparent read voltage may reflect a different data value (e.g., '0011'). This shift can result in increased raw bit error rate (RBER) which can be beyond the error correction capability of the underlying error correction code (ECC).

Aspects of the present disclosure address the above and other deficiencies by having a memory sub-system that compensates for temperature variations in the memory system at a particular level of granularity, such as at a per die level. A semiconductor die is an individual segment of semiconducting material on which functional circuits are fabricated. Each die may include a separate memory device organized into multiple memory blocks, and there may be multiple die included in a single memory system. Depending on the manufacturing process, the memory cells on a particular die may exhibit relatively similar behavior with respect to voltage shift in response to changes in temperature. In general, the voltage shift in response to a change in temperature for one memory cell is likely to be more similar to the voltage shift of another cell on the same die, than to the voltage shift of a memory cell that is on a different die.

Accordingly, in one embodiment, the memory system can determine a separate temperature compensation ("tempco") value for each die in the memory system. The temperature compensation value can be calculated from the voltage levels (threshold voltages) of memory cells subjected to the change in temperature between the time when the memory cell is read and the time when the memory cell is programmed. By using a temperature compensation value calculated from voltage levels for the particular memory cells being read (i.e., for the particular die holding the memory cells), rather than using a general compensation value for the entire memory system, more accurate temperature compensation and read values can be achieved.

As a result, the error rate in the memory system can be decreased, error correction code can be utilized less frequently, and overall performance of the memory system can be improved. Additional details of these temperature compensation techniques are provided below with respect to FIGS. 1-7.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The memory sub-system 110 includes a temperature compensation component 113 that can be used to determine temperature compensation values for the memory system 110 at varying levels of granularity, such as a per die temperature compensation value. The temperature compensation component 113 can further apply the temperature compensation values during data access operations on the memory devices 130, such as read or write operations, to account for voltage shifts attributable to changes in temperature. In some embodiments, the memory sub-system controller 115 includes at least a portion of the temperature compensation component 113. In some embodiments, temperature compensation component 113 is part of the host system 110, an application, or an operating system. In other embodiments, local media controller 135 includes at least a portion of temperature compensation component 113 and is configured to perform the functionality described herein.

The temperature compensation component 113 can determine a temperature compensation value for a die and apply the temperature compensation value during data access operations on the die of memory devices 130. Further details with regards to the operations of the temperature compensation component 113 are described below.

FIG. 2 is a flow diagram of an example method 200 to calculate a temperature compensation value to adjust a voltage level, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the temperature compensation component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, processing logic receives a request to perform a memory access operation, the request identifying a memory cell in a segment of the memory system including at least a portion of the memory device.

The request to perform the memory access operation can be a program (write) or a read request. The segment of the memory system can include a semiconductor die on which the memory device having the memory cell is fabricated. The memory cell can include a multi-level memory cell and is configured to store a voltage at one of a number of voltage levels, each of the voltage levels representing a different logical data value.

At operation 220, processing logic determines that an operating temperature of the memory device satisfies a threshold criterion.

The threshold criterion can be that the operating temperature is at a hot temperature range or a cold temperature range, which is required by a cross temperature condition to occur. In one embodiment, the threshold criterion can be preconfigured static ranges, e.g., hot temperature range=65-70 degrees Celsius and/or cold temperature range=20-25 degrees Celsius. In one embodiment, the threshold criterion can be configured through a configuration file associated with each die of the memory devices. A cross temperature condition occurs when processing logic programs a block to the segment of the memory system at a first temperature range (hot/cold temperature range) and reads a page from the segment of the memory system at a second temperature range (cold/hot temperature range).

In one embodiment, processing logic determines that cross temperature operations of the memory device have satisfied a predetermined criterion. For example, a counter, sample_cnt, can be incremented to count the number of occurrences of the cross temperature operations, as further illustrated in FIG. 5. In one embodiment, the predetermined criterion is satisfied if the number of cross temperature operations is above a count threshold. The count threshold can regulate the frequency a temperature compensation value is recalculated, as further described below.

In one embodiment, processing logic identifies a block to be programmed as either in a first temperature range or a second temperature range. Responsive to identifying the block to be programmed as either in a first temperature range or a second temperature range, processing logic stores a block identifier identifying the block to be programmed by the program request. For example, if the block is programmed at a hot temperature range (e.g., 70-75 degrees Celsius), a block identifier can be stored in a hot write set, the hot write set identifying blocks programmed at the hot temperature range. If the block is programmed at a cold temperature range (e.g., 20-25 degrees Celsius), a block identifier can be stored in a cold write set, the cold write set identifying blocks programmed at the cold temperature range. In one embodiment, if a block is erased or scheduled for garbage collection from the memory device, the block identifier identifying the block can be removed from either the hot write set or the cold write set.

At operation 230, responsive to determining that the operating temperature of the memory device satisfies the threshold criterion, processing logic determines a temperature compensation value corresponding to an access control voltage adjustment value specific to the segment of the memory system. In one embodiment, the counter, sample_cnt, satisfying a predetermined condition (e.g., sample_cnt>1000) can be used to trigger a temperature compensation value recalculation. The access control voltage can be a voltage applied to read the stored voltage level. In another embodiment, the temperature compensation value can be used to compensate (offset) the voltage level when reading the memory cells.

For example, if the operating temperature of the memory device is at the cold (20-25 degrees Celsius) temperature range, processing logic scans the memory blocks in the hot write set and the cold write set. The hot and cold write sets can be array data structures used to store the memory block identifiers identifying when the blocks are programmed while the operating temperature is within either the hot or cold temperature ranges. The memory blocks in these sets can be used to calculate average threshold voltages corresponding to each of the sets for the cold operating temperature range, as further described in FIG. 5. For example, a first average voltage threshold (level) (CT_CT_ave) is calculated, the first average voltage threshold corresponding to blocks programmed at cold temperature range and read at cold temperature range. A second average voltage threshold (HT_CT_ave) is calculated, the second average voltage threshold corresponding to blocks programmed at hot temperature range and read at cold temperature range. HT_CT_ave and/or CT_CT_ave can be calculated by measuring the threshold voltage or threshold voltage shift for random sample of memory cells in the block. For example, HT_CT_ave can be calculated using samples of memory cells of memory blocks identified by the hot write set. Random memory cell can be probed for the threshold voltage levels by reading the memory cell for a shift in the program level, as further illustrated in FIG. 3A-3B.

In one embodiment, if the operating temperature of the memory device is at the hot (65-70 degrees Celsius) temperature range, processing logic scans the hot write set and the cold write set to calculate an average threshold voltage corresponding to each of the sets. For example, a third average threshold voltage (level) (CT_HT_ave) is calculated, the third average threshold voltage corresponding to blocks programmed at cold temperature range and read at hot temperature range. A fourth average threshold voltage (HT_HT_ave) can be calculated, the fourth average threshold voltage corresponding to blocks programmed at hot temperature range and read at hot temperature range. HT_HT_ave and/or CT_HT_ave can be calculated by measuring the threshold voltage or threshold voltage shift for random sample of memory cells in the block.

In one embodiment, processing logic stores a count for the number of blocks used in the sampling. When the sampling count reaches a predetermined threshold (e.g., 1000), processing logic calculates the temperature compensation value using the HT_CT_ave, CT_CT_ave, HT_HT_ave and CT_HT_ave for the hot and cold temperature range. Calculations for the temperature compensation value is further illustrated in FIG. 7.

At operation 240, processing logic adjusts, based on an amount represented by the temperature compensation value, an access control voltage applied to the memory cell during the memory access operation.

The control voltage of the memory cell can be linearly correlated with the temperature compensation value and the control voltage can be adjusted linearly in relation to the temperature compensation value. In another embodiment, the temperature compensation value can be used to offset the read voltage levels.

FIG. 3A is a block diagram illustrating voltage distribution shifts in accordance with some embodiments of the present disclosure. As shown on FIG. 3A, voltage distributions 300 illustrates two levels '0100' and '0101' of a 16 level QLC memory cell storing four bits of data. A memory cell may be programmed to store the logical data value '0100' corresponding to distribution 301 at a hot temperature range by applying a sequence of programming pulses to the memory cell until a program voltage level reaches the range of values within distribution 301. As a temperature associated with the memory cell changes over time to a cold temperature range (such as over a time period between when the memory cell is programmed and when the memory cell is read), the program voltage level (or apparent read voltage) may be affected and the program voltage level associated with distribution 301 shifts to distribution 303. Since distribution 303 falls within range of a distribution associated with a logical state value '0101' (distribution 305), there exists the possibility of a read error. For example, the read voltage level 309 may be decoded as corresponding to logical state '0101' instead of '0100'.

FIG. 3B is a block diagram illustrating voltage distribution shifts in accordance with some embodiments of the present disclosure. As shown on FIG. 3B, voltage distributions 330 is illustrated for two levels '0100' and '0011' of a 16 level QLC memory cell storing four bits of data. The memory cells may be programmed to store the logical data value '0100' corresponding to distribution 331 at a cold temperature range by applying a sequence of programming pulses to the memory cell until a program voltage level reaches the range of values within distribution 331. As a temperature associated with the memory cell changes over time to a hot temperature range (such as over a time period between when the memory cell is programmed and when the memory cell is read), the program voltage level (or apparent read voltage) may be affected and the program voltage level associated with distribution 331 shifts to distribution 333. Since distribution 333 falls within range of a distribution associated with a logical state value '0011' (distribution 335), there exists the possibility of a read error. For example, the read voltage level 339 may be decoded as corresponding to logical state '0011' instead of '0100'.

Figure 4:
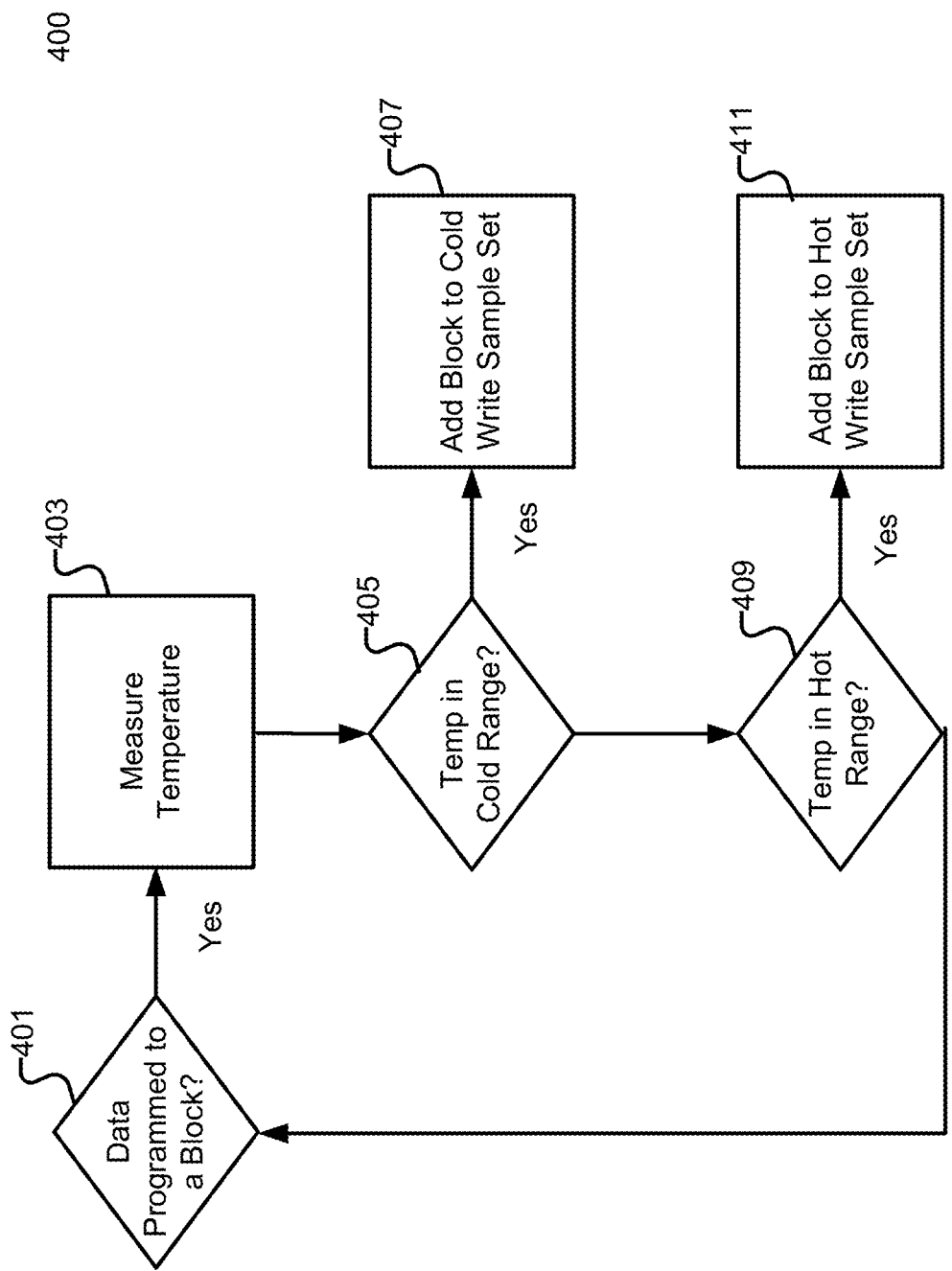
FIG. 4 is a block diagram illustrating a process to track memory blocks that are programmed under a hot temperature range or a cold temperature range in accordance with some embodiments of the present disclosure.

FIG. 4 is a block diagram illustrating a process to track memory blocks that are programmed under a hot temperature range or a cold temperature range in accordance with some embodiments of the present disclosure. Process 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, process 400 is performed by the temperature compensation component 113 of FIG. 1.

At operation 401, processing logic determines that data is programmed to a memory block in memory device 130. The programming can be performed in response to a request from host system 120 to store data in memory device 130.

At operation 403, processing logic measures a temperature of memory device 130. For example, the temperature measurement can be obtained from one or more temperature sensors located in and around memory device 130 and/or temperature measurements from other temperature sensors that are associated with other components of memory subsystem 110 (e.g., controller 115). The temperature compensation component 113 can obtain temperature measurements from one or more temperature sensors to determine whether the memory sub-system 110 is operating at a hot temperature range (65-70 degrees Celsius) or a cold temperature range (20-25 degrees Celsius). In some embodiments, temperature sensors can be configured to periodically and at predefined intervals measure the temperature of memory device 130 and to provide the measured temperature to temperature compensation component 113. In some embodiments, temperature sensors can measure a temperature responsive to one or more commands that can be sent by the memory sub-system controller 115, such as a command to measure a temperature. Depending on the embodiment, the measured temperature can include at least one of a temperature of a semiconductor die on which memory device 130 is fabricated, an operating temperature of the memory sub-system 110 (e.g., obtained from memory sub-system controller 115), or an ambient temperature in an area where memory sub-system 110 is located.

At operation 405, processing logic determines if the measured temperature is within a cold temperature range. The cold temperature range can be 20-25 degrees Celsius, or any other temperature ranges which is less than the hot temperature range.

At operation 407, if the temperature range is within the cold temperature range, processing logic adds a block identifier of the programmed block to a cold write sample set. The cold write sample set can include a list of block identifier identifying blocks which are programmed at a cold temperature range.

At operation 409, if the temperature range is not within the cold temperature range, processing logic determines if the measured temperature is within a hot temperature range. The hot temperature range can be 65-70 degrees Celsius, or any other temperature ranges. If the measured temperature is outside of the hot or cold temperature ranges, processing logic can return to operation 401.

At operation 411, if the temperature range is within the hot temperature range, processing logic adds a block identifier of the programmed block to a hot write sample set. The hot write sample set can include a list of block identifier identifying blocks which are programmed at a hot temperature range.

The cold and/or hot write sample sets can be used to evaluate occurrence of a cross temperature condition, e.g., when a block is programmed at a first (cold/hot) temperature range and read at a second (hot/cold) temperature range. In one embodiment, if the blocks are erased or scheduled for garbage collection, the corresponding block identifier can be removed from the cold and/or hot write sample sets.

Figure 5:
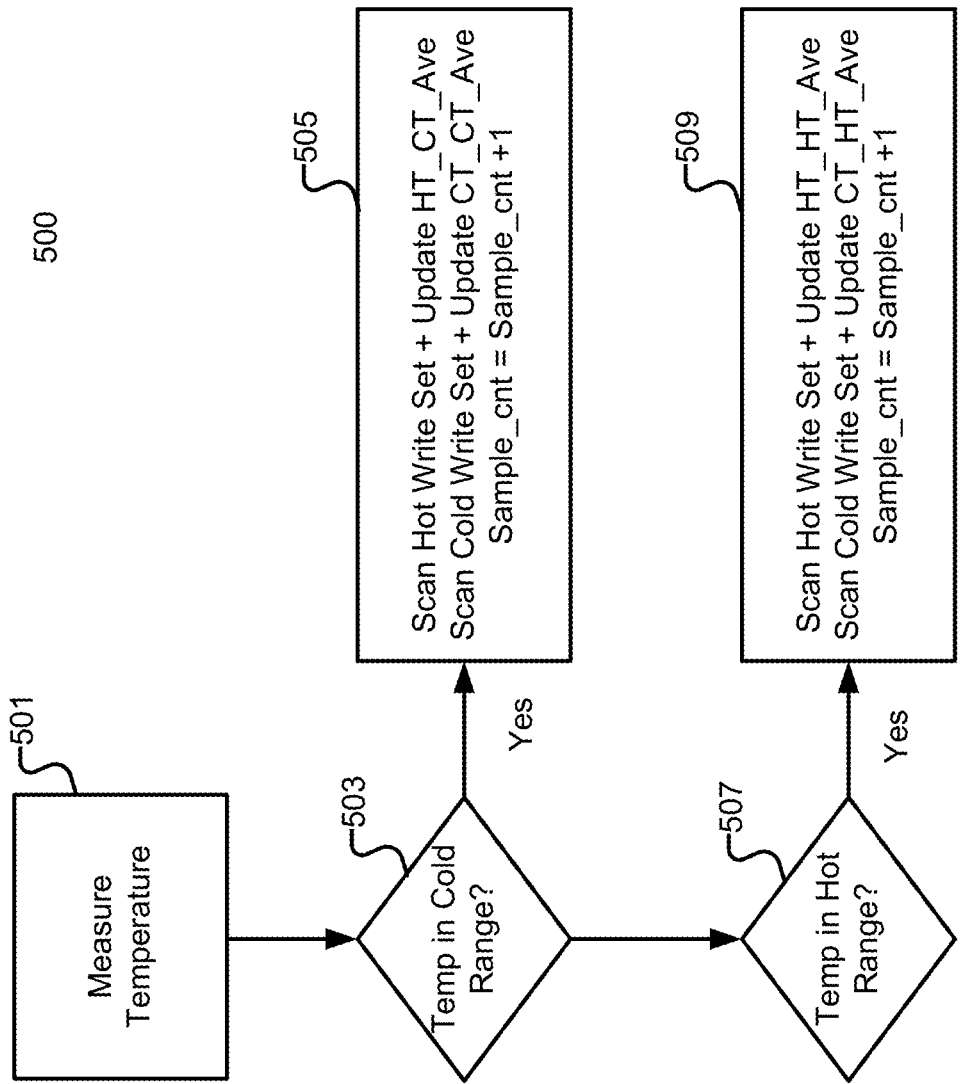
FIG. 5 is a block diagram illustrating a process to scan memory blocks and calculate average threshold voltages for memory blocks under cross temperature conditions in accordance with some embodiments of the present disclosure.

FIG. 5 is a block diagram illustrating a process to scan memory blocks and calculate average threshold voltages for memory blocks under cross temperature conditions in accordance with some embodiments of the present disclosure. Process 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, process 500 is performed by the temperature compensation component 113 of FIG. 1.

At operation 501, processing logic measures a temperature for temperature compensation component 113. For example, the temperature measurement can be obtained from one or more temperature sensors located in and around memory device 130 and/or temperature measurements from other temperature sensors that are associated with other components of memory sub-system 110 (e.g., controller 115).

At operation 503, processing logic determines if temperature is in a cold temperature range. The temperature compensation component 113 can obtain temperature measurements from the one or more temperature sensors to determine whether the memory sub-system 110 is operating at between 20-25 degrees Celsius.

At operation 505, if the temperature range is in a cold temperature range, processing logic can scan through the blocks in both the hot write set and the cold write set. The scanning of a block includes randomly sampling a predetermined number of memory cells from blocks in both of these sets to determine voltage shifts in their read voltages in the current operating temperature. The voltage shifts of a block can be determining by applying a control voltage to the random sample of memory cells to obtain the read voltages of the memory cells. The read voltage can be compared with an expected programming voltage (e.g., a center of a voltage distribution is the expected programming voltage for a logical state in FIG. 3A-3B) for a corresponding logical value stored in the memory cells, the average of the shifts in the memory cells can be used as the shift for the memory block. From the shifts of different memory blocks in the hot write set, processing logic determines an average voltage shift for these memory blocks for the cold read, e.g., HT_CT_ave. From the shifts of different memory blocks in the cold write set, processing logic determines an average voltage shift for these memory blocks for the cold read, e.g., CT_CT_ave. Next, a counter, sample_cnt, can be incremented, where the counter can be used to trigger a tempco recalculation, as further illustrated in FIG. 6. In one embodiment, the counter identifies the number of blocks being sampled. In one embodiment, the counter identifies the number of times a cold/hot temperature range is used to scan the hot/cold write sets, or number of occurrences of cross temperature conditions.

At operation 507, processing logic determines if temperature is in a hot temperature range.

At operation 509, if the temperature range is in a hot temperature range, processing logic scan through the blocks in both the hot write set and the cold write set. The scanning of a block includes randomly sampling a predetermined number of memory cells from a block in both of these sets to determine voltage shifts in their read voltages in the current operating temperature. The voltage shifts of a block can be determining by applying a control voltage to the random sample of memory cells to obtain the read voltages of the memory cells. The read voltages can be compared with an expected programming voltage (e.g., a center of a voltage distribution is the expected programming voltage for a logical state in FIG. 3A-3B) for a corresponding logical value stored in the memory cells, the average of the shifts in the memory cells can be used as the shift for the memory block. From the shifts of different memory blocks in the hot write set, processing logic determines an average voltage shift for these memory blocks for the hot read, e.g., HT_HT_ave. From the shifts of different memory blocks in the cold write set, processing logic determines an average voltage shift for these memory blocks for the hot read, e.g., CT_HT_ave. Next, the counter, sample_cnt, can be incremented, where the counter can be used to trigger a tempco recalculation, as further illustrated in FIG. 6. In one embodiment, the counter identifies the number of blocks being sampled. In one embodiment, the counter identifies the number of times a cold/hot temperature range is used to scan the hot/cold write sets, or number of occurrences of cross temperature conditions.

Figure 6:
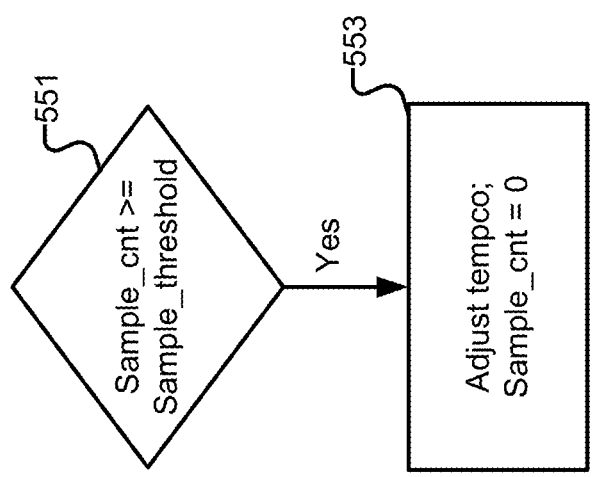
FIG. 6 is a block diagram illustrating a process to adjust a temperature compensation value in accordance with some embodiments of the present disclosure.

FIG. 6 is a block diagram illustrating a process to adjust a temperature compensation value in accordance with some embodiments of the present disclosure. Process 550 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, process 550 is performed by the temperature compensation component 113 of FIG. 1.

At operation 551, processing logic determines if the counter, sample_cnt, satisfies a threshold criterion. In one embodiment, the threshold criterion is satisfied if the value of the counter is greater than or equal to a predetermined threshold (sample_threshold). In one embodiment, sample_threshold can be 1000, or any other values.

Figure 7:
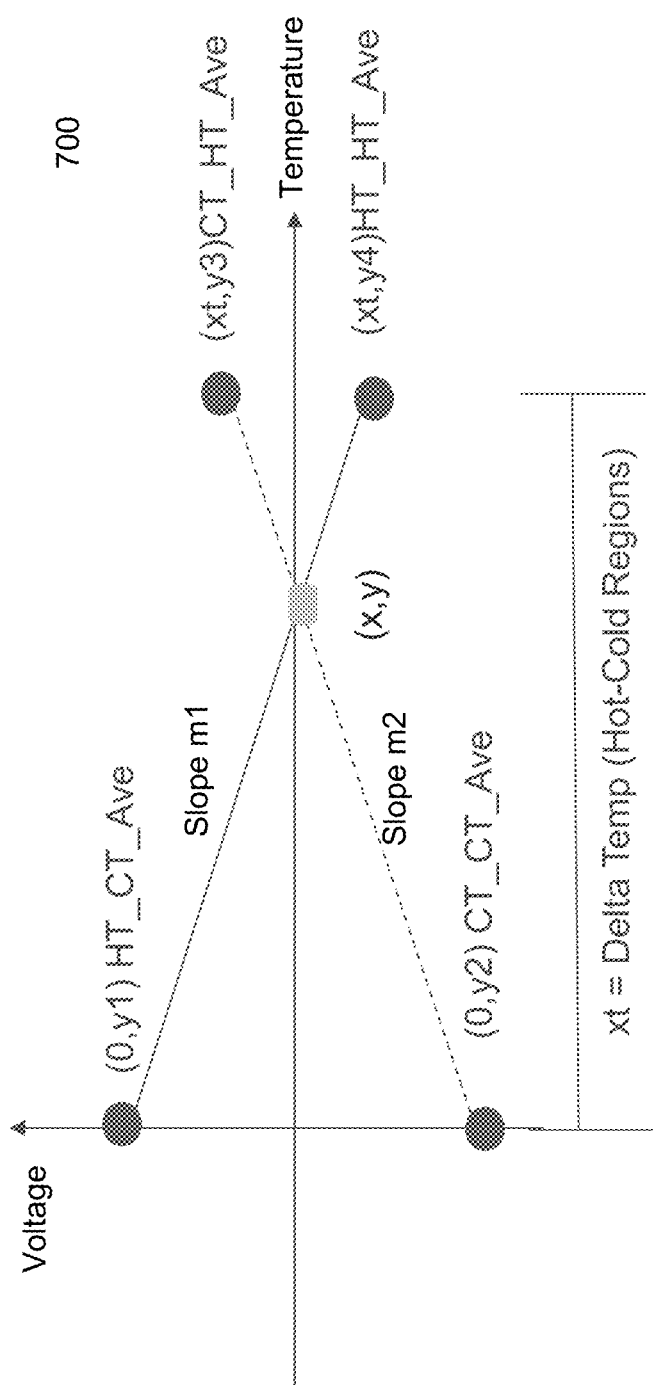
FIG. 7 is a chart illustrating temperature compensation value calculations in accordance with some embodiments of the present disclosure.

At operation 553, if processing logic determines the counter, sample_cnt, satisfies the threshold criterion, processing logic adjusts the temperature compensation value, tempco, as further described in FIG. 7, and resets the counter sample_cnt.

FIG. 7 is a chart illustrating temperature compensation value calculations in accordance with some embodiments of the present disclosure. Referring to FIG. 7, chart 700 shows a plot for voltage versus temperature. From the chart, four points can be plotted corresponding to HT_CT_ave, CT_CT_ave, CT_HT_ave, and HT_HT_ave values. The four points can be plotted at (0, y1), (0, y2), (xt, y3), and (xt, y4), respectively. Given a delta temperature xt=67.5−22.5=45 degrees Celsius, which is between a midpoint of the hot temperature (67.5 degrees Celsius) to a midpoint of the cold temperature range (22.5 degrees Celsius), the four points can be plotted on chart 700.

Slopes m1 and m2 can be determined from:

$$m1 = \frac{y4 - y1}{xt}$$
$$m2 = \frac{y3 - y2}{xt}$$

The intersection point (x, y) can be determined from:

$$x = \frac{y2 - y1}{m1 - m2}$$
$$y = m1 * x + y1$$

and the temperature compensation value ("tempco") can be determined as:

$$tempco = \frac{y}{x}.$$

The calculated temperature compensation value can be stored in an 8-bit register as part of temperature compensation component 113. In one embodiment, each die in memory device 130 can have a corresponding temperature compensation value. In one embodiment, the read voltage levels for memory cells in a die of memory device 130 can be adjusted (or compensated) according to the temperature compensation value for the die.

In one embodiment, processing logic can use the identified temperature compensation value to adjust an access control voltage applied to memory cells for the die of the temperature compensation value by a particular voltage level represented by the temperature compensation value. This adjustment to the access control voltage can account for any voltage shift attributable to the temperature differences between a programming operation and a read operation of the memory cells.

Figure 8:
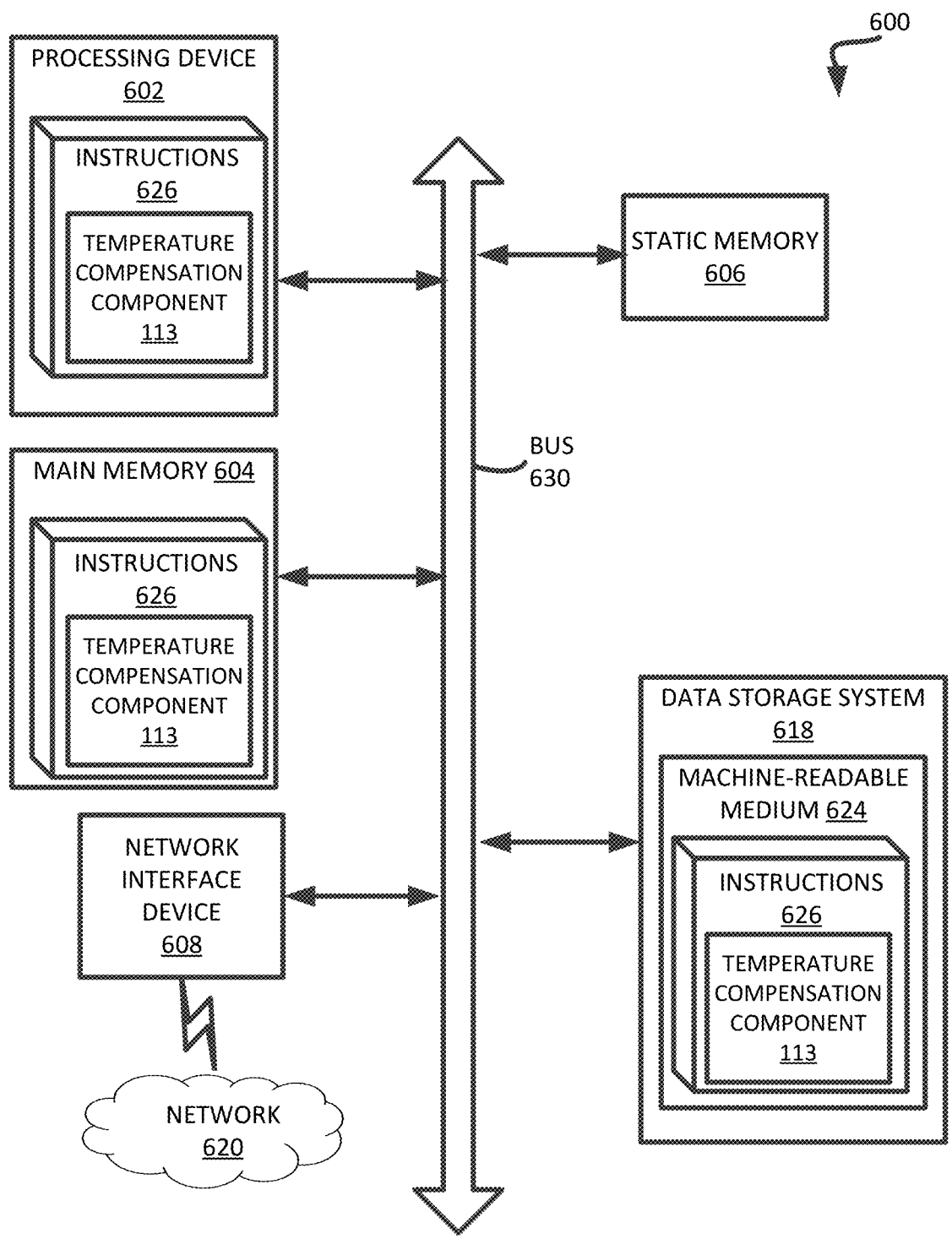
FIG. 8 is a block diagram of an example computer system in which embodiments of the present disclosure may operate.

FIG. 8 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the temperature compensation component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a temperature compensation component (e.g., the temperature compensation component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory system comprising:
 a memory device; and
 a processing device, operatively coupled with the memory device, to perform operations comprising:
  receiving a request to perform a memory access operation, the request identifying a memory cell in a segment of the memory system comprising at least a portion of the memory device;
  determining that an operating temperature of the memory device satisfies a threshold criterion;
  responsive to determining that the operating temperature of the memory device satisfies the threshold criterion, determining a temperature compensation value corresponding to an access control voltage adjustment value specific to the segment of the memory system, wherein the temperature compensation value is determined based on a plurality of average voltage thresholds for blocks programmed and read at a plurality of temperature ranges; and
  adjusting, based on an amount represented by the temperature compensation value, an access control voltage applied to the memory cell during the memory access operation.

2. The memory system of claim 1, wherein the segment of the memory system comprises a semiconductor die on which the memory device having the memory cell is fabricated.

3. The memory system of claim 1, wherein determining that the operating temperature of the memory device satisfies the threshold criterion comprises determining an occurrence of a cross temperature condition caused by programming a block to the segment of the memory system at a first temperature range and reading a page from the segment of the memory system at a second temperature range.

4. The memory system of claim 1, wherein the memory cell comprises a multi-level memory cell and is configured to store a voltage at one of a plurality of voltage levels, each of the plurality of voltage levels representing a different logical data value.

5. The memory system of claim 1, wherein the request comprises a program request, and wherein the processing device is to perform the operations further comprising:
 identifying a block to be programmed as either in a first temperature range or a second temperature range; and
 responsive to identifying the block to be programmed as either in the first temperature range or the second temperature range, storing a block identifier identifying the block to be programmed by the program request.

6. The memory system of claim 1, wherein the processing device is further to perform the operations further comprising:

determining a first average voltage threshold for blocks programmed at a first temperature range and a page of the blocks read at the first temperature range;

determining a second average voltage threshold for blocks programmed at the first temperature range and a page of the blocks read at a second temperature range;

determining a third average voltage threshold for blocks programmed at the second temperature range and a page of the blocks read at the first temperature range; and determining a fourth average voltage threshold for blocks programmed at the second temperature range and a page of the blocks read at the second temperature range, wherein the temperature compensation value is determined based on the first, second, third, and fourth average voltage thresholds.

7. A method comprising:

receiving a request to perform a memory access operation, the request identifying a memory cell in a segment of a memory system comprising at least a portion of a memory device;

determining that a count of cross temperature operations performed on the memory device satisfies a predetermined criterion;

responsive to determining that the count of cross temperature operations of the memory device satisfies the predetermined criterion, determining a temperature compensation value corresponding to an access control voltage adjustment value specific to the segment of the memory system, wherein the predetermined criterion regulates a frequency of determining the temperature compensation value; and adjusting, based on an amount represented by the temperature compensation value, an access control voltage applied to the memory cell during the memory access operation.

8. The method of claim 7, wherein the segment of the memory system comprises a semiconductor die on which the memory device having the memory cell is fabricated.

9. The method of claim 7, wherein the cross temperature condition is caused by programming a block to the segment of the memory system at a first temperature range and reading a page from the segment of the memory system at a second temperature range.

10. The method of claim 7, wherein the memory cell comprises a multi-level memory cell and is configured to store a voltage at one of a plurality of voltage levels, each of the plurality of voltage levels representing a different logical data value.

11. The method of claim 7, wherein the request comprises a program request, and the method further comprising:

identifying a block to be programmed as either in a first temperature range or a second temperature range; and responsive to identifying the block to be programmed as either in the first temperature range or the second temperature range, storing a block identifier identifying the block to be programmed by the program request.

12. The method of claim 7, further comprising:

determining a first average voltage threshold for blocks programmed at a first temperature range and a page of the blocks read at the first temperature range;

determining a second average voltage threshold for blocks programmed at the first temperature range and a page of the blocks read at a second temperature range;

determining a third average voltage threshold for blocks programmed at the second temperature range and a page of the blocks read at t ca first temperature range; and determining a fourth average voltage threshold for blocks programmed at the second temperature range and a page of the blocks read at the second temperature range, wherein the temperature compensation value is determined based on the first, second, third, and fourth average voltage thresholds.

13. The method of claim 7, wherein determining the count of cross temperature operations of the memory device have satisfied the predetermined criterion comprises determining the count of cross temperature operations is above a predetermined threshold.

14. A non-transitory computer-readable storage medium comprising instructions that, when executed by a processing device, cause the processing device to perform operations:

receiving a request to perform a memory access operation, the request identifying a memory cell in a segment of a memory system comprising at least a portion of a memory device;

determining that an operating temperature of the memory device satisfies a threshold criterion;

responsive to determining that on the operating temperature of the memory device satisfies the threshold criterion, determining a temperature compensation value corresponding to an access control voltage adjustment value specific to the segment of the memory system, wherein determining the temperature compensation value further comprises:

determining a first average voltage threshold for blocks programmed at a first temperature range and a page of the blocks read at the first temperature range;

determining a second average voltage threshold for blocks programmed at the first temperature range and a page of the blocks read at a second temperature range;

determining a third average voltage threshold for blocks programmed at the second temperature range and a page of the blocks read at the first temperature range; and determining a fourth average voltage threshold for blocks programmed at the second temperature range and a page of the blocks read at the second temperature range, wherein the temperature compensation value is determined based on the first, second, third, and fourth average voltage thresholds; and adjusting, based on an amount represented by the temperature compensation value, an access control voltage applied to the memory cell during the memory access operation.

15. The non-transitory computer-readable storage medium of claim 14, wherein the segment of the memory system comprises a semiconductor die on which the memory device having the memory cell is fabricated.

16. The non-transitory computer-readable storage medium of claim 14, wherein determining that the operating temperature of the memory devices satisfies the threshold criterion comprises determining an occurrence of a cross temperature condition caused by programming a block to the segment of the memory system at the first temperature range and reading a page from the segment of the memory system at the second temperature range.

17. The non-transitory computer-readable storage medium of claim 14, wherein the memory cell comprises a multi-level memory cell and is configured to store a voltage at one of a plurality of voltage levels, each of the plurality of voltage levels representing a different logical data value.

18. The non-transitory computer-readable storage medium of claim 14, wherein the request comprises a program request, and wherein the processing device is to perform the operations further comprising:
   identifying a block to be programmed as either in the first temperature range or the second temperature range; and
   responsive to identifying the block to be programmed as either in a first temperature range or the second temperature range, storing a block identifier identifying the block to be programmed by the program request.

19. The non-transitory computer-readable storage medium of claim 14, wherein the processing device is further to perform the operations further comprising:
   determining that a count of cross temperature operations of the memory device satisfies a predetermined criterion.

20. The memory system of claim 1, wherein the temperature compensation value is determined responsive to a count of cross temperature operations satisfying a predetermined criterion.

* * * * *